(12) United States Patent
Pu et al.

(10) Patent No.: US 7,759,170 B2
(45) Date of Patent: Jul. 20, 2010

(54) FABRICATION METHOD OF SEMICONDUCTOR PACKAGE HAVING HEAT DISSIPATION DEVICE

(75) Inventors: Han-Ping Pu, Taichung (TW); Chien-Ping Huang, Taichung (TW); Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 12/710,450

(22) Filed: Feb. 23, 2010

(65) Prior Publication Data

US 2010/0151631 A1 Jun. 17, 2010

Related U.S. Application Data

(62) Division of application No. 11/647,832, filed on Dec. 29, 2006, now Pat. No. 7,671,466.

(30) Foreign Application Priority Data

Feb. 27, 2006 (TW) .............................. 95106554 A

(51) Int. Cl.
*H01L 21/00* (2006.01)
*H01L 23/34* (2006.01)
*H05K 7/20* (2006.01)

(52) U.S. Cl. .................... 438/122; 438/127; 257/707; 257/714; 257/717; 257/720; 361/689; 361/699

(58) Field of Classification Search ............... None
See application file for complete search history.

(56) References Cited

U.S. PATENT DOCUMENTS

| | | | |
|---|---|---|---|
| 5,311,402 A | 5/1994 | Kobayashi et al. | |
| 5,637,920 A | 6/1997 | Loo | |
| 5,880,524 A | 3/1999 | Xie | |
| 6,011,304 A | 1/2000 | Mertol | |
| 6,444,498 B1 | 9/2002 | Huang et al. | |
| 6,458,626 B1 | 10/2002 | Huang et al. | |
| 6,525,420 B2 | 2/2003 | Zuo et al. | |
| 7,115,987 B2 | 10/2006 | Holalkere et al. | |
| 7,434,308 B2 | 10/2008 | Lu et al. | |
| 7,671,466 B2 * | 3/2010 | Pu et al. ................ | 257/707 |
| 2003/0062149 A1 | 4/2003 | Goodson et al. | |
| 2004/0190251 A1 | 9/2004 | Prasher et al. | |
| 2005/0116335 A1 | 6/2005 | Karim | |
| 2005/0117299 A1 | 6/2005 | Prasher et al. | |
| 2005/0205241 A1 | 9/2005 | Goodson et al. | |
| 2006/0125088 A1 | 6/2006 | Huang et al. | |

\* cited by examiner

*Primary Examiner*—Alonzo Chambliss
(74) *Attorney, Agent, or Firm*—Peter F. Corless; Steven M. Jensen; Edwards Angell Palmer & Dodge LLP

(57) ABSTRACT

A semiconductor package with a heat dissipating device and a fabrication method of the semiconductor package are provided. A chip is mounted on a substrate. The heat dissipating device is mounted on the chip, and includes an accommodating room, and a first opening and a second opening that communicate with the accommodating room. An encapsulant is formed between the heat dissipating device and the substrate to encapsulate the chip. A cutting process is performed to remove a non-electrical part of structure and expose the first and second openings from the encapsulant. A cooling fluid is received in the accommodating room to absorb and dissipate heat produced by the chip. The heat dissipating device covers the encapsulant and the chip to provide a maximum heat transfer area for the semiconductor package.

14 Claims, 6 Drawing Sheets

FABRICATION METHOD OF SEMICONDUCTOR PACKAGE HAVING HEAT DISSIPATION DEVICE

CROSS-REFERENCE TO RELATED APPLICATION(S)

This application is a divisional of application U.S. Ser. No. 11/647,832, filed on Dec. 29, 2006, now U.S. Pat. No. 7,671,466.

FIELD OF THE INVENTION

The present invention relates to semiconductor packages and fabrication methods thereof, and more particularly, to a semiconductor package having a heat dissipating device and a fabrication method of the semiconductor package.

BACKGROUND OF THE INVENTION

Flip-chip ball grid array (FCBGA) semiconductor package, as understandable from its name, uses a flip-chip technique to form electrical connection between a chip and a chip carrier (such as a substrate) that are incorporated in the semiconductor package. Particularly, a plurality of solder bumps are implanted on an active surface (i.e. a surface where electronic components are disposed) of the chip, and are bonded to the substrate so as to electrically connect the chip to the substrate.

As to heat dissipation of the FCBGA semiconductor package, there are two methods conventionally available as those disclosed in U.S. Pat. Nos. 5,311,402, 5,637,920, and 6,011,304. One method involves having the active surface of the flip chip mounted on the substrate by the solder bumps and having an inactive surface of the chip exposed from an encapsulant that encapsulates the chip, such that heat generated during the operation of the chip can be dissipated through the exposed inactive surface of the chip. The other method involves mounting a heat spreader on the substrate, wherein the heat spreader includes a flat portion, and a supporting portion connected to the flat portion and supporting the flat portion above the substrate. The flat portion of the heat spreader comes into contact with the flip chip, and is at least partly exposed from the encapsulant to dissipate the heat from the chip.

However, by the above methods, heat can only be dissipated through the exposed inactive surface of the chip or the exposed flat portion of the heat spreader, which usually does not provide satisfactory heat dissipating efficiency for the semiconductor package. Moreover, for the case having the flat portion of the heat spreader exposed, during a molding process for forming the encapsulant, which is performed after the chip and the heat spreader are mounted to the substrate, the heat spreader must have its top surface abutting against a top wall of a mold cavity used for shaping the encapsulant, so as to prevent resin flashes from being formed on the top surface of the heat spreader. This thus makes the fabrication processes of the semiconductor package become complicated.

Accordingly, U.S. Pat. Nos. 6,444,498 and 6,458,626 propose a flip-chip semiconductor package with a heat dissipating structure including a heat spreader mounted on a chip. The heat dissipating structure and the chip are integrally encapsulated by an encapsulant, with the heat spreader being completely exposed from the encapsulant. Such arrangement reinforces the whole structure of the semiconductor package and desirably improves the heat dissipating performance for the semiconductor package.

The above technology disclosed in U.S. Pat. Nos. 6,444,498, and 6,458,626 is however not considered suitable and feasible for use with a chip producing a very large amount of heat during operation, such as central processing unit (CPU). In other words, for such highly heat-generating chip, a mechanism that can even more improve the heat dissipating efficiency of the semiconductor package is required. To this end, U.S. Pat. No. 5,880,524 proposes a semiconductor package integrated with a heat pipe lid therein. As shown in FIG. 1, this semiconductor package 1 comprises a substrate 11, a flip chip 10 mounted on the substrate 11, and a lid 12 mounted on the substrate 11 and the chip 10. The lid 12 includes a first accommodating room 121 for receiving the chip 10 therein, and a second accommodating room 122 provided on the first accommodating room 121 and for accommodating a heat pipe 120 filled with a cooling fluid. A heat transfer layer 14 is disposed between a top surface 1211 of the first accommodating room 121 and the chip 10, such that heat produced from the chip 10 can be transmitted to the heat transfer layer 14 and then to the cooling fluid in the heat pipe 120. A heat sink 13 is mounted on the lid 12, and absorbs the heat of the cooling fluid in the heat pipe 120 and dissipates the heat out of the semiconductor package 1.

Although the foregoing heat pipe lid achieves better heat dissipating performance than the conventional heat spreader, it is adhered to the substrate and the chip and thus is liable to become detached therefrom, thereby leading to a reliability problem. Further, the contact area between the heat pipe lid and the chip is provided as the only heat dissipating area for the semiconductor package, which is not sufficient for accomplishing satisfactory heat dissipation performance.

U.S. Pat. No. 6,525,420 also discloses a semiconductor package integrated with a heat pipe and thus encounters the same drawbacks as above.

Therefore, the problem to be solved here is to provide a semiconductor package with heat dissipation for a chip therein being satisfactorily performed.

SUMMARY OF THE INVENTION

In view of the aforesaid drawbacks of the prior art, an objective of the present invention is to provide a semiconductor package having a heat dissipating device and a fabrication method of the semiconductor package, so as to make the semiconductor package highly efficient in heat dissipation.

Another objective of the present invention is to provide a semiconductor package having a heat dissipating device and a fabrication method of the semiconductor package, so as to effectively embed the heat dissipating device in the semiconductor package and thereby enhance the overall reliability and heat dissipating efficiency of the semiconductor package.

A further objective of the present invention is to provide a semiconductor package having a heat dissipating device and a fabrication method of the semiconductor package, which can externally connect a heat exchange device to the semiconductor package to thereby improve the heat dissipating performance of the semiconductor package.

In order to achieve the above and other objectives, the present invention proposes a fabrication method of a semiconductor package having a heat dissipating device. The fabrication method comprises the steps of: mounting a chip on a substrate; mounting a heat dissipating device on the chip, wherein the heat dissipating device comprises an accommodating room, and a first opening and a second opening that communicate with the accommodating room; performing a molding process to form an encapsulant that encapsulates the chip and the heat dissipating device, such that a package unit is formed; and performing a cutting process to remove a non-electrical part of the package unit and expose the first and second openings from the encapsulant.

By the foregoing fabrication method, the present invention also proposes a semiconductor package with a heat dissipating device. The semiconductor package comprises a substrate; a chip mounted on the substrate; the heat dissipating device mounted on the chip, wherein the heat dissipating device comprises an accommodating room, and a first opening and a second opening that communicate with the accommodating room, so as to allow a cooling fluid to be received in the accommodating room to absorb and dissipate heat generated by the chip; and an encapsulant formed between the heat dissipating device and the substrate to encapsulate the chip.

The accommodating room of the heat dissipating device can be in the form of a hollow chamber or a winding pipe.

The semiconductor package of the present invention can be externally connected to a heat exchange circulation system by a circulation pipe communicating with the first and second openings of the heat dissipating device, so as to allow the cooling fluid from the heat dissipating device to be transmitted to and cooled by the heat exchange circulation system. The cooled cooling fluid then flows back to the heat dissipating device and again is used for absorption and dissipation of heat from the chip, such that the heat dissipation performance is improved for the semiconductor package.

If the accommodating room is in the form of a hollow chamber, one of the first and second openings communicating with the hollow chamber can be sealed, and the other one of the first and second openings allows the cooling fluid to be introduced into the hollow chamber and is then sealed when the hollow chamber is filled with the cooling fluid. As such, the heat dissipating device containing the cooling fluid may perform heat exchange with the chip.

In another embodiment, prior to the molding process, an interface layer is formed on a top surface of the heat dissipating device, wherein adhesion between the interface layer and the encapsulant is greater than that between the interface layer and the heat dissipating device, and adhesion between the interface layer and the heat dissipating device is smaller than that between the heat dissipating device and the encapsulant. When the molding process and the cutting process are completed, a removing process is performed to remove the interface layer and the encapsulant partially formed on the interface layer, such that the top surface of the heat dissipating device is exposed.

In a further embodiment, prior to the molding process, an interface layer is formed on the top surface of the heat dissipating device, wherein adhesion between the interface layer and the encapsulant is smaller than that between the interface layer and the heat dissipating device. The interface layer is made of a metal with high thermal conductivity. When the molding process and the cutting process are completed, a removing process is performed to remove the encapsulant partially formed on the interface layer, and the interface layer remains on the top surface of the heat dissipating device to enhance the heat transfer performance.

Therefore, according to the semiconductor package and the fabrication method thereof in the present invention, a chip is mounted on and electrically connected to a substrate, and a heat dissipating device is mounted on the chip, wherein the heat dissipating device comprises an accommodating room, and a first opening and a second opening that communicate with the accommodating room. The heat dissipating device and the chip are encapsulated and firmly combined together by an encapsulant formed on the substrate in a molding process. By a cutting process performed after the molding process, the first and second openings of the heat dissipating device are exposed. The first and second openings can be connected to a heat exchange circulation system through a circulation pipe, or alternatively, the accommodating room can be filled with a cooling fluid and the first and second openings are sealed, so as to allow heat from the chip to be transferred to the heat dissipating device and dissipated out of the semiconductor package. The alternative arrangements desirably make implementation of the present invention flexible. Moreover, the heat dissipating device covers the chip and the encapsulant to provide a maximum heat transfer area for the semiconductor package, which thereby solves the problems such as unsatisfactory heat dissipating performance and degraded reliability caused by detachment of a heat pipe lid as encountered in the prior art.

DETAILED DESCRIPTION OF THE EMBODIMENTS

Preferred embodiments of a semiconductor package having a heat dissipating device and a fabrication method of the semiconductor package as proposed in the present invention are described as follows with reference to FIGS. 2 to 7. It should be understood that the drawings are simplified schematic diagrams only showing the elements relevant to the present invention, and the layout of elements could be more complicated in practical implementation.

First Preferred Embodiment

FIGS. 2A to 2F are schematic diagrams showing a fabrication method of a semiconductor package having a heat dissipating device in accordance with a first preferred embodiment of the present invention.

Figure 1:
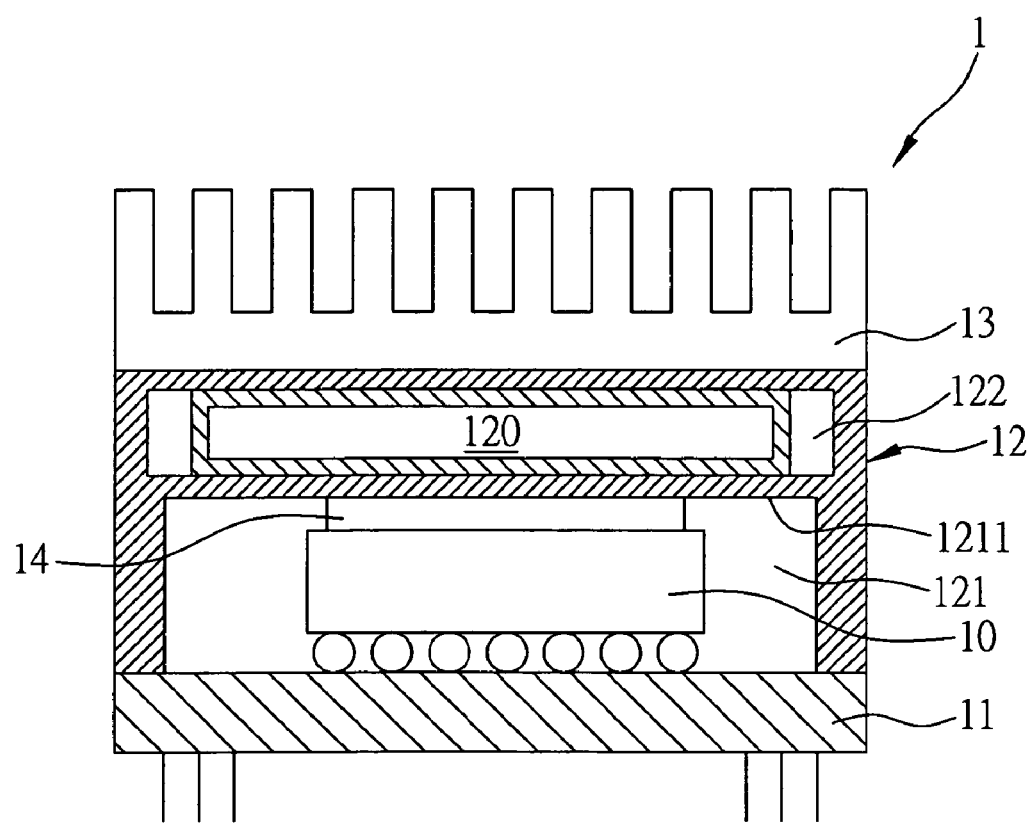
FIG. 1 (PRIOR ART) is a cross-sectional view of a semiconductor package integrated with a heat pipe lid as disclosed in U.S. Pat. No. 5,880,524.
Figure 2A:
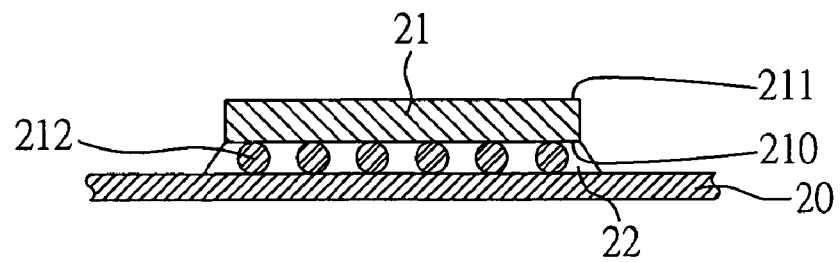
FIGS. 2A to 2F are schematic diagrams showing a fabrication method of a semiconductor package having a heat dissipating device in accordance with a first preferred embodiment of the present invention.

As shown in FIG. 2A, firstly, a chip 21 is mounted on a substrate 20. The chip 21 has an active surface 210 and an opposite inactive surface 211, wherein an array of conductive bumps 212 are formed on the active surface 210. The conductive bumps 212 are bonded to the substrate 20 such that the chip 21 is electrically connected to the substrate 20 in a flip-chip manner by means of the conductive bumps 212. An underfill material 22 can further fill a gap between the chip 21 and the substrate 20 such that the chip 21 is more firmly attached to the substrate 20.

Figure 2B:
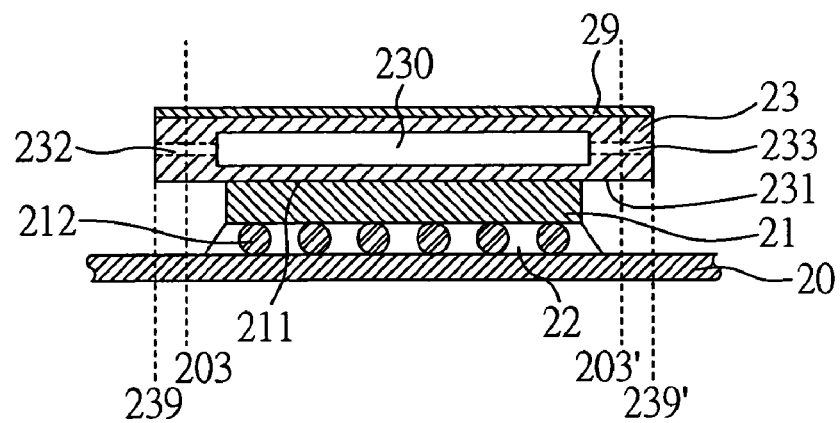

Next, as shown in FIG. 2B, a heat dissipating device 23 is mounted on the chip 21 by attaching a contact surface 231 of the heat dissipating device 23 to the inactive surface 211 of the chip 21 via a thermally conductive adhesive (not shown). An interface layer 29 is disposed on a top surface of the heat dissipating device 23, and can be a polyimide tape (PI tape), a metal patch made of such as copper or aluminum, a highly heat-resistant organic patch made of an organic material such as FR4 or BT (bismaleimide triazine), or a highly heat-resistant paper patch. The interface layer 29 has adhesion with an encapsulant (which is subsequently formed to encapsulate the chip 21) greater than adhesion with the heat dissipating device 23, and the heat dissipating device 23 has adhesion with the interface layer 29 smaller than adhesion with the encapsulant. Moreover, horizontal dimensions of the heat dissipating device 23 need to be equal to or larger than those of the semiconductor package to be fabricated. For example, as shown in FIG. 2B, the horizontal dimensions (as bordered by dashed lines 239, 239') of the heat dissipating device 23 are greater than the horizontal dimensions (as bordered by dashed lines 203, 203') of the semiconductor package to be fabricated.

Figure 2C:
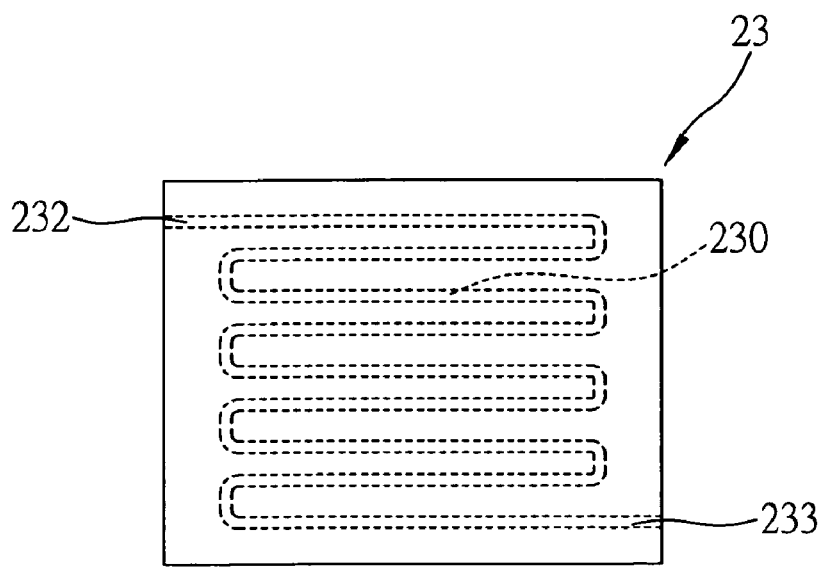

As shown in FIG. 2C, the heat dissipating device 23 comprises an accommodating room 230, and a first opening 232 and a second opening 233 that communicate with the accommodating room 230. The accommodating room 230 is in the form of a winding pipe provided in the heat dissipating device 23, and the first and second openings 232, 233 are formed at two ends of the winding pipe respectively and located at approximately diagonal positions of the heat dissipating device 23.

Figure 2D:
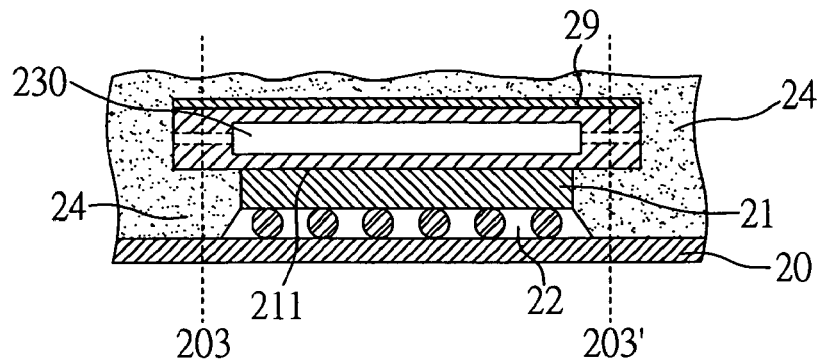

As shown in FIG. 2D, the combined structure of the interface layer 29, the heat dissipating device 23, the chip 21 and the substrate 20 is placed in a mold cavity of an encapsulation mold (not shown) to perform a molding process, whereby an encapsulant 24 is formed on the substrate 20 and encapsulates the chip 21, the heat dissipating device 23 and the interface layer 29.

Figure 2E:
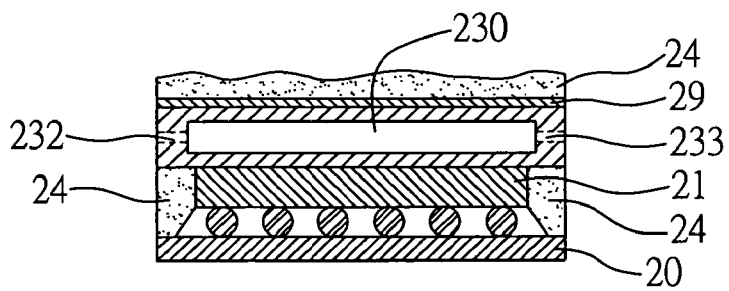

As shown in FIG. 2E, a cutting process is performed along cutting lines corresponding to the horizontal dimensions (as bordered by dashed lines 203, 203') of the semiconductor package to be fabricated. By the cutting process, a non-electrical part of the combined structure after the molding process is removed, and the first and second openings 232, 233 are exposed from the encapsulant 24. Particularly, a peripheral part of the combined structure, which is located beyond the horizontal dimensions of the semiconductor package to be fabricated, is removed; for example, the removed part of the combined structure includes a peripheral portion of the substrate 20, a peripheral portion of the encapsulant 24, a peripheral portion of the heat dissipating device 23, and a peripheral portion of the interface layer 29, which are located beyond the horizontal dimensions bordered by the dashed lines 203, 203' of the semiconductor package to be fabrication, as shown in FIG. 2D.

Figure 2F:
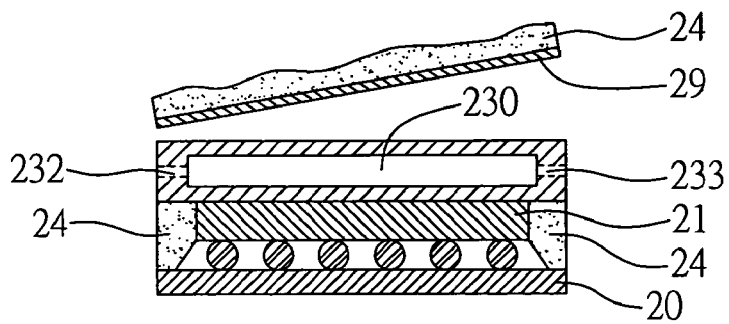

As shown in FIG. 2F, after the cutting process, both the interface layer 29 and the encapsulant 24 partially formed on the interface layer 29 are removed. Since adhesion between the interface layer 29 and the heat dissipating device 23 is smaller than that between the interface layer 29 and the encapsulant 24, the interface layer 29 and the encapsulant 24 thereon can be together removed (e.g. by peeling) from the heat dissipating device 23. Further, as adhesion between the heat dissipating device 23 and the encapsulant 24 is greater than that between the heat dissipating device 23 and the interface layer 29, removal of the interface layer 29 from the heat dissipating device 23 does not affect the bonding between the heat dissipating device 23 and the encapsulant 24. As a result, the heat dissipating device 23 is exposed from the encapsulant 24 when the interface layer 29 is removed, and thus enhances the heat dissipating efficiency and assures good appearance of the fabricated semiconductor package.

Figure 2G:
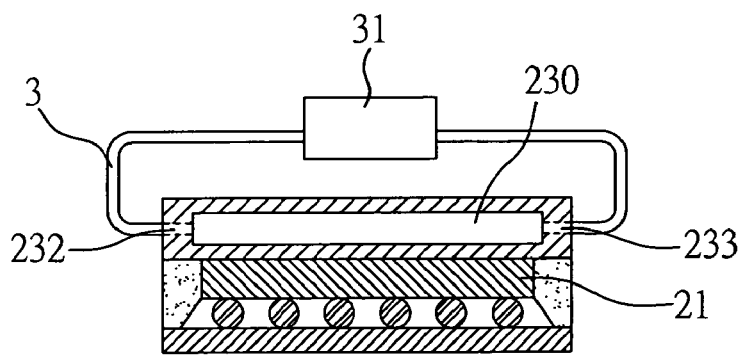
FIG. 2G is a cross-sectional view showing a heat exchange circulation system connected to the semiconductor package in accordance with the present invention.

Referring to FIG. 2G, the first and second openings 232, 233 of the heat dissipating device 23, which are exposed from the encapsulant 24, are connected to a heat exchange circulation system 31 by a circulation pipe 3. A cooling fluid is allowed to circulate through the heat dissipating device 23 and the heat exchange circulation system 31. Particularly, the cooling fluid flowing through the accommodating room 230 of the heat dissipating device 23 can absorb heat produced from the chip 21, and the cooling fluid absorbing the heat can be cooled in the heat exchange circulation system 31 and then flows back to the heat dissipating device 23 to be ready for another heat absorption. By such mechanism, the heat may be effectively transferred away from the chip 21 and dissipated out of the semiconductor package.

Figure 3:
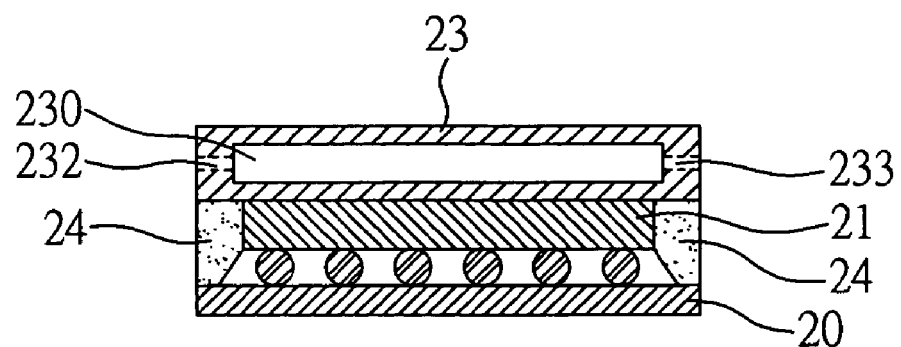
FIG. 3 is a cross-sectional view of the semiconductor package having a heat dissipating device in accordance with the first preferred embodiment of the present invention.

Referring to FIG. 3, by the foregoing fabrication method, the present invention also discloses a semiconductor package, comprising: a substrate 20; a chip 21 mounted on the substrate 20; a heat dissipating device 23 mounted on the chip 21, wherein the heat dissipating device 23 comprises an accommodating room 230, a first opening 232 and a second opening 233 that communicate with the accommodating room 230, so as to allow a cooling fluid to be received in the accommodating room 230 to absorb and dissipate of heat generated by the chip 21; and an encapsulant 24 formed between the heat dissipating device 23 and the substrate 20 to encapsulate the chip 21.

Second Preferred Embodiment

Figure 4:
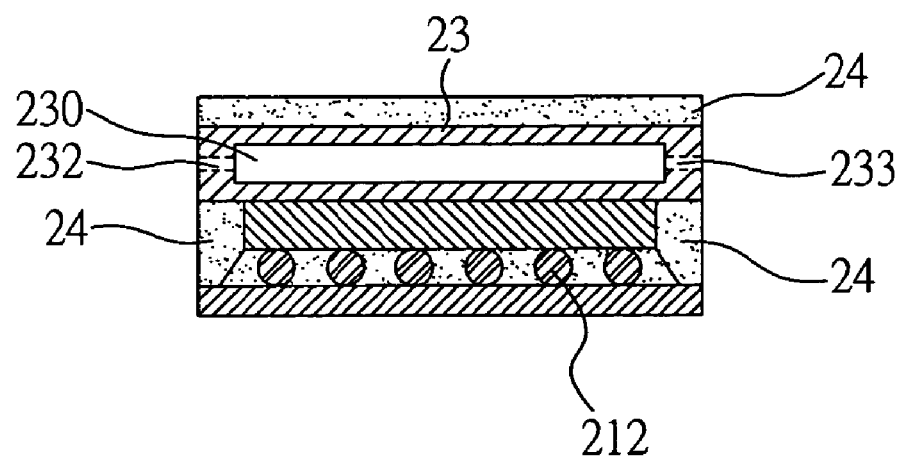
FIG. 4 is a cross-sectional view of a semiconductor package having a heat dissipating device in accordance with a second preferred embodiment of the present invention.

FIG. 4 is a cross-sectional view of a semiconductor package having a heat dissipating device in accordance with a second preferred embodiment of the present invention.

The semiconductor package of the second embodiment is similar to that of the first embodiment, with a primary difference in that, in the second embodiment, there is not provided an interface layer on the top surface of the heat dissipating device 23, such that the encapsulant 24 formed by the molding process also covers the top surface of the heat dissipating device 23.

Therefore, the second embodiment without the use of the interface layer advantageously makes the fabrication processes of the semiconductor package simpler than those in the first embodiment.

Third Preferred Embodiment

Figure 5A:
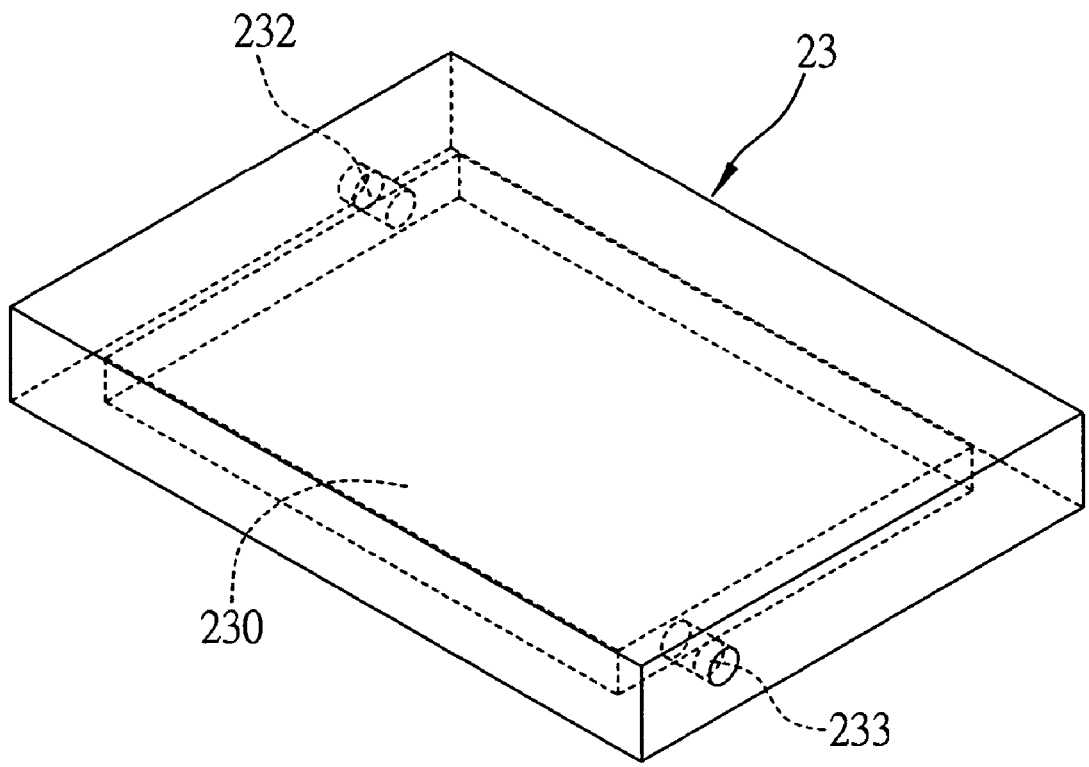
FIG. 5A is a schematic diagram showing a heat dissipating device comprising a hollow chamber for a semiconductor package in accordance with a third preferred embodiment of the present invention.
Figure 5B:
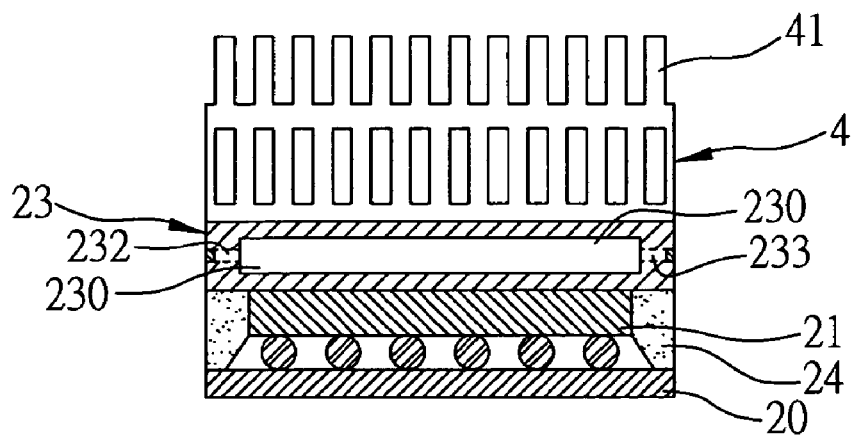
FIG. 5B is a cross-sectional view showing a heat sink mounted to the semiconductor package in accordance with the third preferred embodiment of the present invention.

FIG. 5A is a schematic diagram of a heat dissipating device for a semiconductor package in accordance with a third preferred embodiment of the present invention, and FIG. 5B is a cross-sectional view of the semiconductor package of the third embodiment.

The semiconductor package of the third embodiment is similar to that of the first embodiment, with a primary difference in that, in the third embodiment, the accommodating room 230 of the heat dissipating device 23 is in the form of a hollow chamber, as shown in FIG. 5A. The first and second openings 232, 233 of the heat dissipating device 23 communicate with the hollow chamber. One of the first and second openings 232, 233 is sealed, and a cooling fluid is introduced into the hollow chamber through the other one of the first and second openings 232, 233, which is then sealed when the hollow chamber is filled with the cooling fluid. The cooling fluid in the hollow chamber can perform heat exchange with the chip 21 and absorb heat generated by the chip 21.

Referring to FIG. 5B, further in this embodiment, a heat sink 4 having heat dissipating fins 41 can be mounted on the top surface of the heat dissipating device 23, and is used to dissipate the heat absorbed by the heat dissipating device 23.

Fourth Preferred Embodiment

Figure 6:
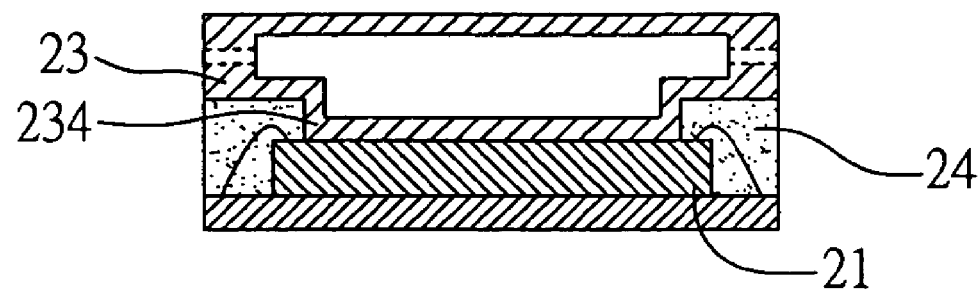
FIG. 6 is a cross-sectional view of a semiconductor package having a heat dissipating device in accordance with a fourth preferred embodiment of the present invention.

FIG. 6 is a cross-sectional view of a semiconductor package having a heat dissipating device in accordance with a fourth preferred embodiment of the present invention.

The semiconductor package of the fourth embodiment can be accomplished by modifying the structure in the first, second or third embodiment. In the fourth embodiment, primary modifications as compared with the foregoing embodiments include the chip 21 being electrically connected to the substrate 20 by bonding wires, and the heat dissipating device 23 further comprising a protruding portion 234 attached to the chip 21 at a position (e.g. a central position) where no bonding wires are provided.

Fifth Preferred Embodiment

Figure 7:
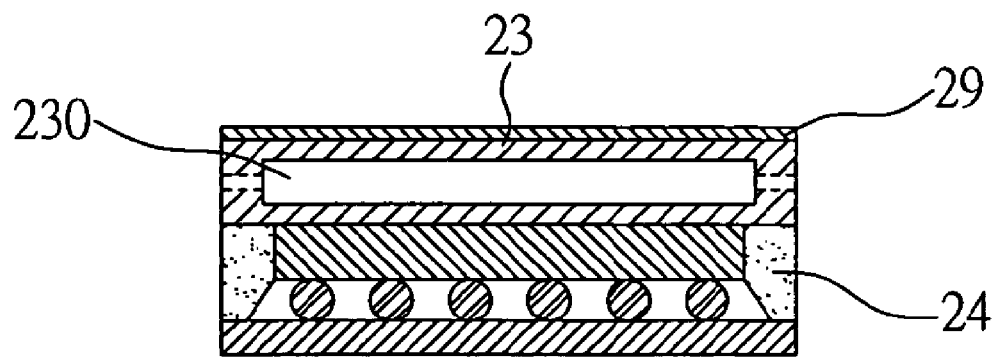
FIG. 7 is a cross-sectional view of a semiconductor package having a heat dissipating device in accordance with a fifth preferred embodiment of the present invention.

FIG. 7 is a cross-sectional view of a semiconductor package having a heat dissipating device in accordance with a fifth preferred embodiment of the present invention.

The semiconductor package of the fifth embodiment can be accomplished by modifying the structure in the first, third or fourth embodiment. A primary difference in the fifth embodiment from the first, third and fourth embodiment is that, the interface layer 29 used in this embodiment has a different property of adhesion. Particularly, adhesion between the encapsulant 24 and the interface layer 29 disposed on the heat dissipating device 23 is smaller than that between the encapsulant 24 and the heat dissipating device 23. As a result, the encapsulant 24 partially formed on the interface layer 29 can be easily removed without damaging the semiconductor package, and delamination between the heat dissipating device 23 and the encapsulant 24 is not likely to occur during the removing process.

In this embodiment, the interface layer 29 is an electroplated gold layer. Alternatively, the interface layer 29 may be made of another metallic material such as chromium, nickel or chromium-nickel alloy, or an organic material such as polytetrafluoro ethylene (Teflon), as long as the material provides the interface layer 29 with the above property of adhesion and high thermal conductivity. Thereby, after removing the encapsulant 24 partially formed on the interface layer 29, the interface layer 29 with high thermal conductivity remains on the top surface of the heat dissipating device 23 and thus enhances the heat dissipating efficiency of the semiconductor package. This beneficial effect works well especially in the case that the accommodating room 230 of the heat dissipating device 23 is in the form of a hollow chamber.

Therefore, according to the semiconductor package and the fabrication method thereof in the present invention, a chip is mounted on and electrically connected to a substrate, and a heat dissipating device is mounted on the chip, wherein the heat dissipating device comprises an accommodating room, and a first opening and a second opening that communicate with the accommodating room. The heat dissipating device and the chip are encapsulated and firmly combined together by an encapsulant formed on the substrate in a molding process. By a cutting process performed after the molding process, the first and second openings of the heat dissipating device are exposed. The first and second openings can be connected to a heat exchange circulation system through a circulation pipe, or alternatively, the accommodating room can be filled with a cooling fluid and the first and second openings are sealed, so as to allow heat from the chip to be transferred to the heat dissipating device and dissipated out of the semiconductor package. The alternative arrangements desirably make implementation of the present invention flexible. Moreover, the heat dissipating device covers the chip and the encapsulant to provide a maximum heat transfer area for the semiconductor package, which thereby solves the problems such as unsatisfactory heat dissipating performance and degraded reliability caused by detachment of a heat pipe lid as encountered in the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a semiconductor package, comprising the steps of:
   mounting a chip on a substrate;
   mounting a heat dissipating device on the chip, wherein the heat dissipating device comprises an accommodating room, and a first opening and a second opening that communicate with the accommodating room, and wherein an interface layer is formed on a top surface of the heat dissipating device;
   performing a molding process to form an encapsulant that encapsulates the chip, the heat dissipating device and the interface layer, such that a package unit is formed;
   performing a cutting process to cut the package unit along cutting lines corresponding to predetermined dimensions of the semiconductor package, so as to remove a non-electrical part of the package unit, which is located beyond the predetermined dimensions of the semiconductor package, and expose the first and second openings from the encapsulant; and
   removing the encapsulant partially formed on the interface layer.

2. The fabrication method of claim 1, wherein adhesion between the interface layer and the encapsulant is greater than that between the interface layer and the heat dissipating device, and adhesion between the heat dissipating device and the interface layer is smaller than that between the heat dissipating device and the encapsulant, such that the interface layer is removed along with removal of the encapsulant partially formed thereon.

3. The fabrication method of claim 2, wherein the interface layer is one of a polyimide tape, a metal patch, a highly heat-resistant organic patch, and a highly heat-resistant paper patch.

4. The fabrication method of claim 1, wherein adhesion between the encapsulant and the interface layer is smaller than that between the encapsulant and the heat dissipating device.

5. The fabrication method of claim 4, wherein the interface layer is made of one of gold, nickel, chromium, nickel-chromium alloy, and polytetrafluoro ethylene.

6. The fabrication method of claim 1, wherein the accommodating room is in the form of one of a hollow chamber and a winding pipe.

7. The fabrication method of claim 6, further comprising the steps of sealing one of the first and second openings of the heat dissipating device if the accommodating room is in the form of the hollow chamber, and introducing a cooling fluid into the hollow chamber through the other one of the first and second openings, which is sealed when the hollow chamber is filled with the cooling fluid, so as to allow the cooling fluid in the hollow chamber to perform heat exchange with the chip.

8. The fabrication method of claim 1, wherein the first and second openings of the heat dissipating device are connected to a heat exchange circulation system through a circulation pipe, such that a cooling fluid circulating through the heat dissipating device and the heat exchange circulation system is cooled in the heat exchange circulation system and flows to the heat dissipating device to be ready for heat exchange with the chip.

9. The fabrication method of claim 1, wherein the chip is electrically connected to the substrate by conductive bumps or bonding wires.

10. The fabrication method of claim 9, wherein the heat dissipating device further comprises a protruding portion attached to the chip at a position free of the bonding wires.

11. A fabrication method of a semiconductor package, comprising the steps of:
mounting a chip on a substrate;
mounting a heat dissipating device on the chip, wherein the heat dissipating device comprises an accommodating room, and a first opening and a second opening that communicate with the accommodating room;
performing a molding process to form an encapsulant that encapsulates the chip and the heat dissipating device, such that a package unit is formed; and
performing a cutting process to cut the package unit along cutting lines corresponding to predetermined dimensions of the semiconductor package, so as to remove a nonelectrical part of the package unit, which is located beyond the predetermined dimensions of the semiconductor package, and expose the first and second openings from the encapsulant.

12. The fabrication method of claim 11, wherein the accommodating room is in the form of a winding pipe, and the first and second openings communicating with the winding pipe are connected to a heat exchange circulation system by a circulation pipe, such that a cooling fluid circulating through the heat dissipating device and the heat exchange circulation system is cooled in the heat exchange circulation system and flows to the heat dissipating device to be ready for heat exchange with the chip.

13. The fabrication method of claim 11, wherein the chip is electrically connected to the substrate by conductive bumps or bonding wires.

14. The fabrication method of claim 13, wherein the heat dissipating device further comprises a protruding portion attached to the chip at a position free of the bonding wires.

* * * * *